United States Patent [19]

Cowan et al.

[11] 4,402,571

[45] Sep. 6, 1983

[54] METHOD FOR PRODUCING A SURFACE RELIEF PATTERN

[75] Inventors: James J. Cowan, Lexington; Arthur M. Gerber, Belmont; Warren D. Slafer, Arlington, all of Mass.

[73] Assignee: Polaroid Corporation, Cambridge, Mass.

[21] Appl. No.: 234,959

[22] Filed: Feb. 17, 1981

[51] Int. Cl.³ .............................................. G02B 5/18
[52] U.S. Cl. ............................ 350/162.17; 350/162.2; 350/3.61
[58] Field of Search ................ 350/162.17, 3.61, 162.2

[56] References Cited

U.S. PATENT DOCUMENTS

| 3,815,969 | 6/1974 | Fletcher et al. | 350/3.61 |
| 3,957,354 | 5/1976 | Knop | 350/162.19 |
| 4,044,939 | 8/1977 | Horst et al. | 228/176 |

OTHER PUBLICATIONS

Smith et al., *New Applications of Submicrometer Structures . . .*, Scanning Electron Microscopy, 1978, vol. 1, pp. 33-40.

Gale, *Sinusoidal Relief Gratings . . .*, Optics Communications, vol. 18, #3, Aug. 1976, pp. 292-297.

*Primary Examiner*—John K. Corbin
*Assistant Examiner*—William Propp
*Attorney, Agent, or Firm*—Philip G. Kiely

[57] ABSTRACT

Surface relief patterns of predetermined configuration are fabricated by a process which involves exposing a photosensitive material at a first position to a laser interference pattern, rotating said material about an axis perpendicular to its surface to a second position, exposing said material at said second position to a laser interference pattern, wherein at least one and preferably both of said exposures is individually below the effective threshold for linear response of said material, the points of intersection of the two fringe patterns being exposed above said threshold as a result of the combined exposures, and developing said material. The method provides a facile technique for the manufacture of surface relief patterns and is particularly useful when the pattern is of submicrometer size and difficult to manufacture by mechanical means.

17 Claims, 23 Drawing Figures

METHOD FOR PRODUCING A SURFACE RELIEF PATTERN

BACKGROUND OF THE INVENTION

The preparation of surface relief structures in photosensitive materials is well known. Over the years, the art has learned how to reduce the dimensions of the relief lines or holes (viewed normal to the surface) to the point where they are measured in terms of micrometers and fractions of micrometers.

Extensive studies have been made, in particular, of periodic one dimensional structures prepared in positive type photosensitive materials or photoresists. (It will be appreciated that the terms "one dimensional" and "two dimensional" are terms of art describing the relief structure from a view normal to the surface). One type of photoresist contains a photosensitive polymer which when exposed to light becomes soluble in an appropriate water base developer. After exposure and development, the initially flat surface of the photoresist becomes a surface relief structure whose depth varies depending upon the photoresist that has been etched away by the developer in proportion to the exposure light intensity. When exposed to an intensity variation that is periodic, such as a light interference pattern, a periodic surface profile will be formed which is everywhere proportional to the initial interference intensity pattern. Precise relief structures of this type can be made easily over relatively large areas using laser interference techniques.

It is known in the art to form relief diffraction gratings employing laser interference techniques. In general, such gratings are formed by exposing a photosensitive material such as a photoresist to two coherent interfering laser beams (recording beams) whose wave fronts are substantially plane and parallel. When such beams interfere, there is produced a stationary periodic fringe pattern consisting of maxima and minima of intensity. The spacing between adjacent maxima (or minima) is determined by the angle between the beams and by the wavelength of the exposing light. Depending upon the optical system used, substantially any spacing can be obtained down to about half the wavelength of the exposing light. The photosensitive material will thus be exposed to a periodic variation in intensity across its surface.

The above description applies to the formation of straight line gratings (one-dimensional gratings); that is, the maxima or minima of the developed image appear as straight parallel lines when viewed normal to the surface. A crossed grating (two-dimensional grating) can be obtained by rotating the photosensitive material 90° about an axis perpendicular to the center of the surface subsequent to the first exposure and exposing a second time. In this case, the surface is subjected to two periodic intensity variations at right angles to each other. Upon development, the resulting relief structure will consist of a rectangular array of peaks and valleys; in the case of a positive photoresist, the peaks correspond to the areas where the combined intensity of the two exposures was the least, or where there was no exposure, and the valleys to the areas where the exposure was the greatest.

Variations in the symmetry of the above described array are also possible. For example, by changing the angle between the two beams after the first exposure, one obtains a different grating spacing for each of the two perpendicular orientations. This can lead to points of intersection which are oblong instead of round. Alternatively, if the exposure plate is rotated to form an angle other than 90° between the two exposure positions, one would obtain a diamond-shaped rather than a square point of intersection array.

If such photosensitive material is a positive photoresist, then upon application of a developer those areas receiving the largest exposure will be preferentially etched away relative to those areas receiving the least exposure. After sufficient development time, the photoresist surface will be a periodic relief pattern whose depth depends on the original interference exposure. A positive photoresist is rendered soluble by impinging light and thereby susceptible to etching by the developer. Alternatively, a photoresist could be chosen which would harden upon photoexposure (negative photoresist) whereupon the unexposed areas would be dissolved by appropriate treatment.

As examples of positive-acting photoresists mention may be made of initially hydrophobic, low molecular weight resins containing sensitizer, which, upon absorbing radiation change the solubility of the coating from aqueous alkali insoluble to aqueous alkali soluble. Suitable resins include phenol formaldehyde novolaks, novolaks in combination with styrene, methyl styrene and styrene-maleic anhydride copolymers and melamines.

As examples of representative negative-acting photoresists; mention may be made of polyvinyl cinnamate derivatives, vinyl ester containing cinnamylidene and alkyl ester prepolymers.

Additional details regarding positive and negative photoresist may be found, for example in W. S. DeForest, *Photoresist Materials and Processes*, McGraw-Hill, N.Y., 1975.

The photoresist is applied to any suitable substrate such as glass, silicon, plastic film or the like, through conventional precedures. Positive photoresists are preferred and they are usually applied in liquid form at room temperature to an appropriately cleaned substrate by spin coating in thicknesses which range from a fraction of one micron to a few microns depending on the spin rate and the photoresist. Dip coating and other coating techniques can also be utilized. In order to drive off any remaining solvents, the photoresist layer and substrate are usually exposed to an elevated temperature for a short period of time, a procedure known as "pre-baking", typically 90° C. for 20 minutes. Sensitivity of the photoresist is usually greatest without any pre-baking and a long pre-bake at lower temperature, e.g., 1 hour at 70° C., leaves the photoresist more sensitive than a short pre-bake at elevated temperature, e.g., 30 minutes at 90° C.

The photoresist is, of course, exposed to light to which it is sensitive in a predetermined pattern and then developed. Typical lasers and their associated wavelengths include the argon ion laser (458 nm) and the He-Cd laser (442 nm) with coherence lengths of about 5 cm and 12 cm, respectively. As shown in FIG. 1, light from the laser, polarized perpendicular to the plane of incidence, is split by a 50-50 beam splitter so that half of the light intensity is incident on one mirror and the other half is incident on a second mirror. The light is reflected from each of these mirrors through an expansion lens and a spatial filter such that the expanded beam is incident on the whole target area where the photoresist coated substrate is located. The two intersecting beams, being derived from one coherent source and having traveled along substantially equal paths from the beam splitter, form interference fringes. The spacing (d) between adjacent maxima (or minima) is given by the equation $d = \lambda/(2 \sin \theta)$ in which $\lambda$ is the wavelength of the laser light and $\theta$ is the angle of incidence to the target plate of each beam (i.e., one-half of the angle between the two beams).

Exposure is carried out until a sufficient intensity level is attained. Exposure times are related to the size of the target area to be exposed. For example, for the He-Cd laser ($\lambda = 442$ nm) with a spatial filter distance to the target of 50 inches, a 40 times expansion lens and a square target 10 inches on each side, exposure times of up to one hour are necessary. With the argon laser, the exposure times are approximately half as large, since even though the available power is larger, the photoresist is less sensitive at the longer wavelength.

Knop, in U.S. Pat. No. 3,957,354, describes a subtraction filtering techniques which employs diffraction for discriminatorily subtracting unwanted spectral wavelength portions of polychromatic illuminating light. The zero diffraction order color characteristics of the subtractive color filter employing a diffracting medium, including a pattern of spatially distributed diffraction elements, are determined solely by the waveform profile of each diffraction element and the absolute magnitude of the effective optical peak amplitude of the waveform profile.

Fletcher et al., U.S. Pat. No. 3,815,969, teaches a holographic recording medium employing a substrate having a diffraction grating composed of a plurality of spaced line ridges on a surface thereof.

Linear relief patterns formed by laser beam interference have been used to produce crystals in a specific crystallographic orientation. Thus, "Orientation of Crystalline Overlayers on Amorphous Substrates by Artificially Produced Surface Relief Structure" by Dale Clifton Flanders, submitted in partial fulfillment of the requirements for the degree of Doctor of Philosophy, Massachusetts Institute of Technology, Cambridge, Mass., January 1978 describes linear relief structures and the growing of single potassium chloride crystals thereon. The crystals assumed the orientation of the substrate and were randomly located along the troughs of the relief pattern and non-uniform in size. The linear relief structure in the substrate was produced by soft X-ray lithographic exposure through a mask produced by laser beam interference followed by reactive-ion-etching. Similar procedures are described in Appl. Phys. Lett., Vol. 32, No. 6, Mar. 15, 1978, p. 349–350.

In Scanning Electron Microscopy, 1978, Vol. 1, SEM Inc., A.M.F., O'Hare, Ill., p. 33–40, there is set forth a procedure for fabricating gratings having linewidths of 100 nm and less wherein a photoresist is exposed to radiation in some desired pattern. It is stated that, "The radiation can be a scanned beam, a focused optical or electron image, a hologram, or an optical or X-ray shadow of a mask. Following exposure, a development step removes either be exposed or unexposed regions (i.e., positive or negative resist), thereby leaving a resist pattern in relief on the substrate surface."

Horst et al., U.S. Pat. No. 4,404,939, teaches the preparation of a diffraction grating master which can contain up to 800 lines per millimeter, in which two series of diffraction gratings are exposed on a photoresist which is thereafter developed. Although the two series of lines can be exposed on the photoresist before developing, the patent states that the superimposed diffraction gratings in the photoresist coating are more sharply defined when the photoresist is developed after each exposure to a grating mask.

Gale, Sinusoidal Relief Gratings For Zero-Order Reconstruction Of Black-And-White Images, Optical Communications, Vol. 18, No. 3, p. 292 (1976) teaches that high quality black-and-white images can be reconstructed using zero order transmitted light from surface relief sinusoidal phase gratings modulated with image information. If the grating period is chosen sufficiently fine, these recordings can be read out in conventional slide projectors and microfiche readers. The article discloses the formation of a crossed, 1.4 $\mu$m grating pattern by exposing a photoresist to an interference pattern using a laser and then rotating the substrate 90° and re-exposing the substrate.

It has long been known that to achieve a given visual result (color, light intensity, etc.), the profile of the surface relief structure should have a known particular configuration. In order to realize such relief structures, the art has employed various techniques to structure or manipulate the light pattern to which the photoresist will be exposed since the photoresist will form a positive or negative image (depending on whether a positive or negative photoresist is used) of that pattern. As the elements of the relief pattern have become smaller, i.e., as the number of lines per millimeter has increased, it has become more and more difficult to prepare intricate patterns to be projected onto or exposed on a photoresist. This is particularly true where the width of a line or diameter of a hole in the photoresist in one micron or less, i.e., a pattern having 1,000 or more lines per millimeter.

A method has now been discovered in which accurate relief patterns can be made in a photoresist in which the individual features of the relief pattern can be of submicron size and in which the size and shape of the relief pattern is controlled, to a great extent, by manipulation of the exposure and development parameters of the photoresist as distinguished from the pattern or image to be projected onto the photoresist. The invention permits an almost infinite variety of predetermined contours to be realized, ranging from tiny holes in a flat surface to projections rising from a surface in the form of flat-topped pedestals or steep spires or lollipop shaped projections, with or without channels, the longitudinal walls being terraced or unterraced as desired. Diffraction gratings of any desired geometric configuration, symmetrical or asymmetrical, can be achieved. The individual holes in the photoresist surface can be circular, oblong or diamond shaped, as desired.

It is, accordingly, the object of this invention to provide a method in which relief contours in a photosensitive material can be fabricated to provide any predetermined desired shape or geometric configuration. This and other objects of the invention will become apparent to those skilled in the art from the following detailed description.

SUMMARY OF THE INVENTION

The present invention relates to the fabrication of predetermined relief contours in a photosensitive material and more particularly to a method of producing a surface relief pattern of predetermined configuration in a photosensitive material by exposing the photosensitive material to two different laser interference patterns, at least one and preferably each of the exposures being individually below the effective threshold of linear response of the material and the points of interception being exposed above said threshold as a result of the combined exposures, and developing the material.

BRIEF DESCRIPTION OF THE INVENTION

Figure 3A:
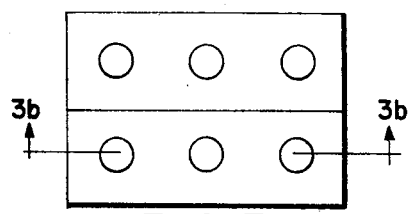
FIG. 3(a) is a top view of a first embodiment of the invention.
Figure 3B:
Figure 4A:
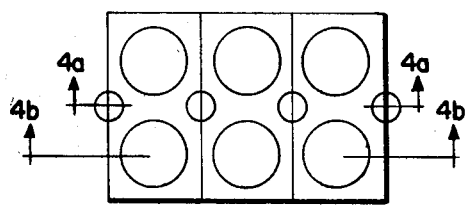
Figure 4B:
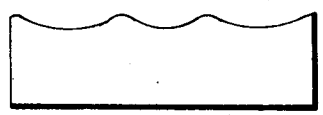
Figure 4C:

FIG. 3(b) a cross-section through line 3b—3b of FIG. 3a;

FIG. 4(a) is a top view of a second embodiment of the invention,

FIG. 4(b) a cross-section through line 4b—4b of FIG. 4a,

FIG. 4(c) a cross-section through lines 4c—4c, and

Figure 5A:
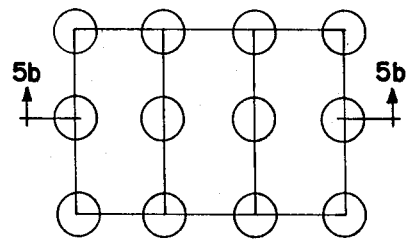
Figure 5B:
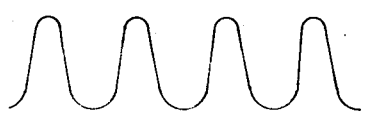
Figure 4D:
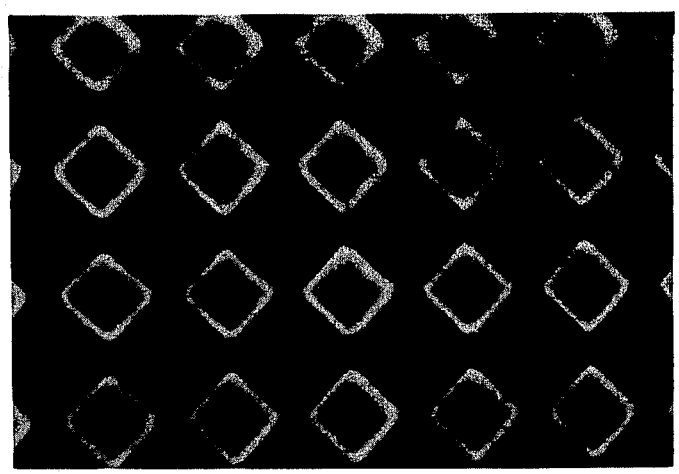

FIG. 4(d) a photomicrograph of the embodiment of FIG. 4a;

FIG. 5(a) is a top view of a third embodiment of the invention,

FIG 5(b) a cross-section through line 5b—5b of FIG. 5a, and

Figure 5C:
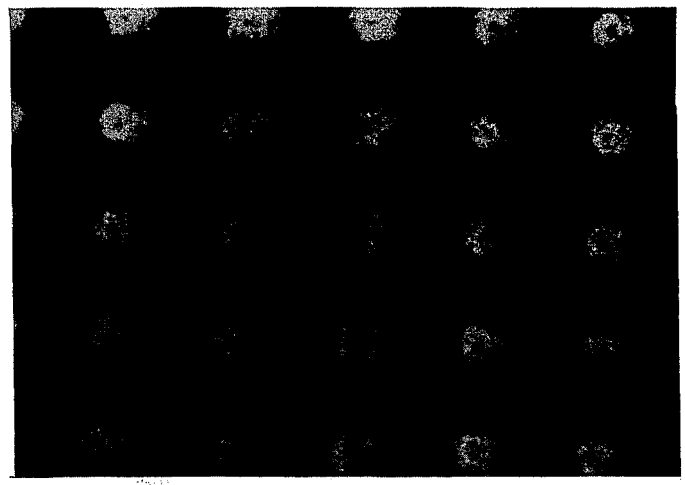
Figure 6:
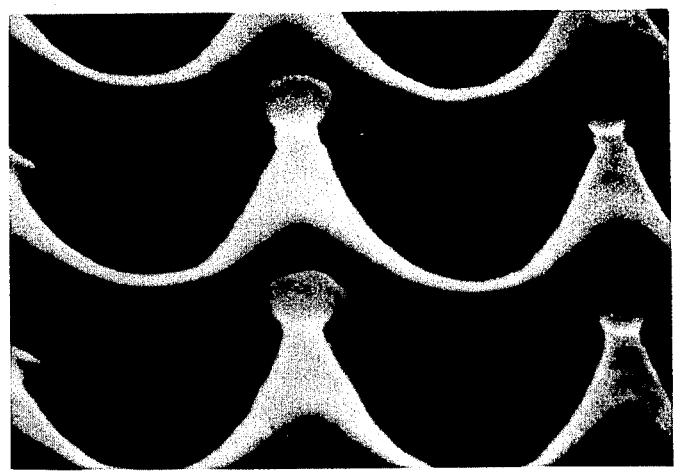
Figure 7C:
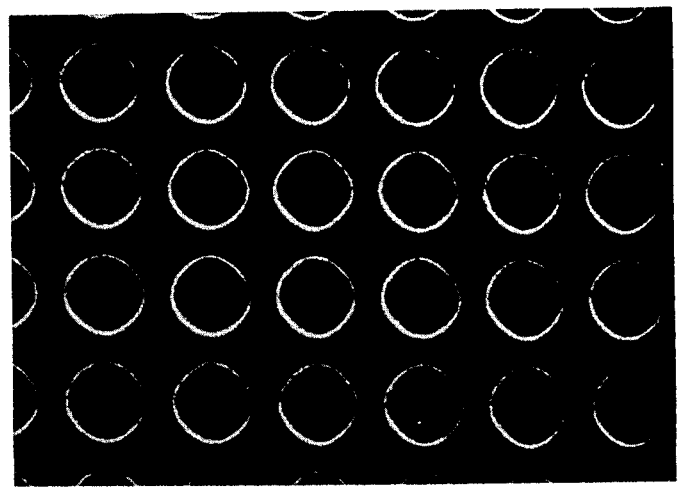
Figure 7A:
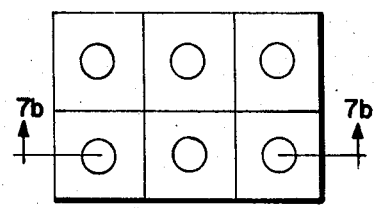
Figure 7B:
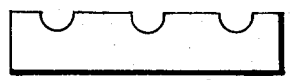

FIG. 5(c) a photomicrograph of the embodiment of FIG. 5a;

FIG. 6 is a photomicrograph of a fourth embodiment of the invention;

FIG. 7(a) is a top view of a fifth embodiment of the invention,

FIG. 7(b) a cross-section through line 7b—7b of FIG. 7a, and

Figure 8A:
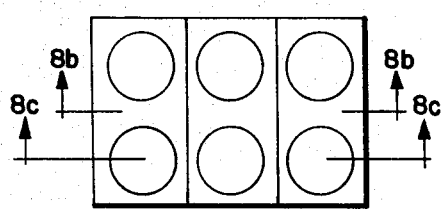
Figure 8B:

FIG. 7(c) a photomicrograph of the embodiment of FIG. 7a;

FIG. 8(a) is a top view of a sixth embodiment of the invention,

FIG. 8(b) a cross-section through line 8b—8b of FIG. 8a, and

Figure 8C:
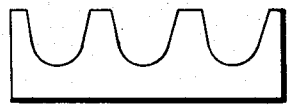

FIG. 8(c) a cross-section through line 8c—8c of FIG. 8a, and

Figure 9A:
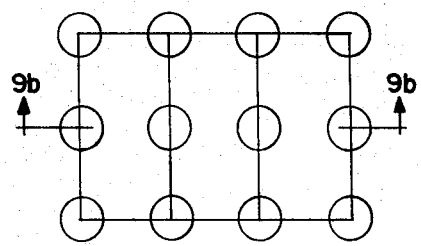
Figure 9B:
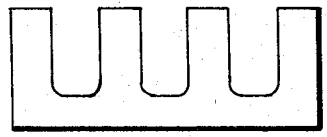
Figure 8D:
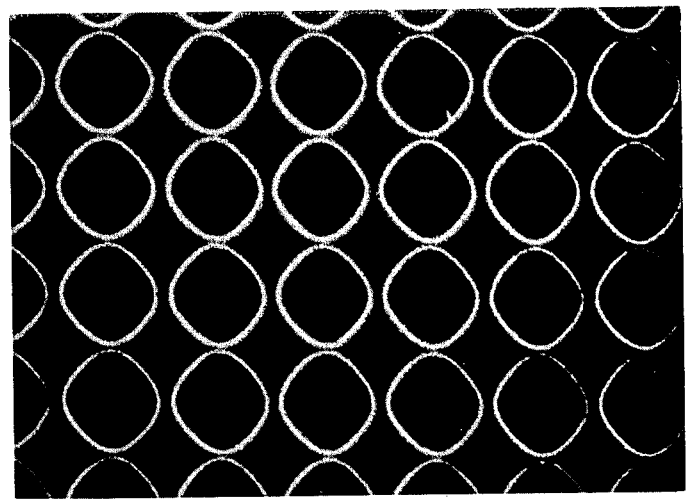

FIG. 8(d) a photomicrograph of the embodiment of FIG. 8a;

FIG. 9(a) is a top view of a seventh embodiment of the invention,

FIG. 9(b) a cross-section through line 9b—9b of FIG. 9a, and

Figure 9C:
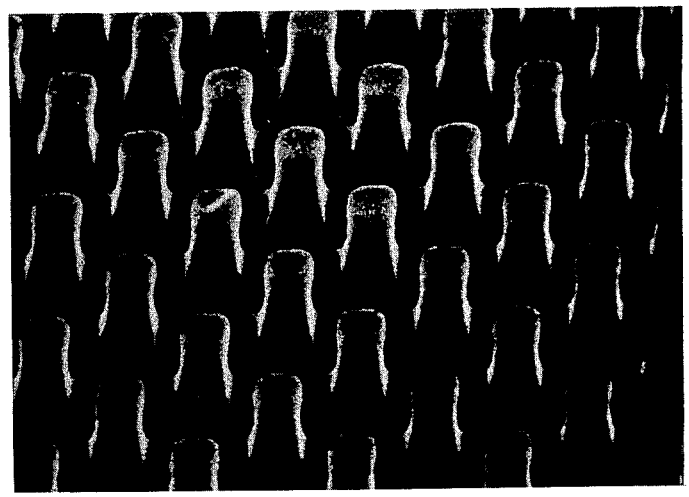

FIG. 9(c) a photomicrograph of the embodiment of FIG. 9a; and

Figure 10:
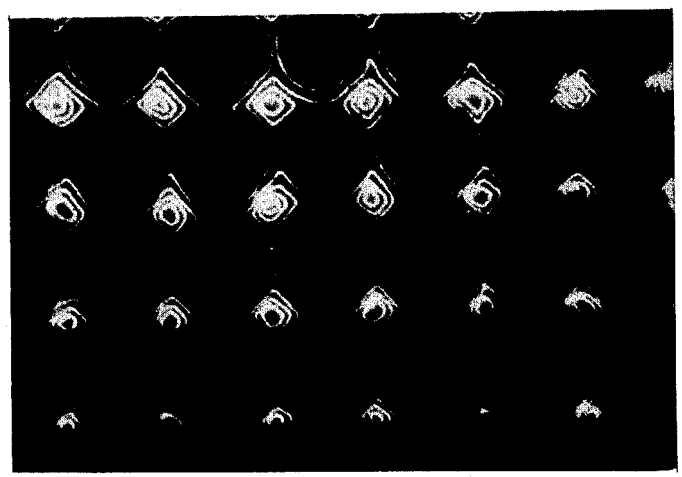

FIG. 10 is a photomicrograph of an eighth embodiment of the invention.

DESCRIPTION OF THE INVENTION

Figure 1:
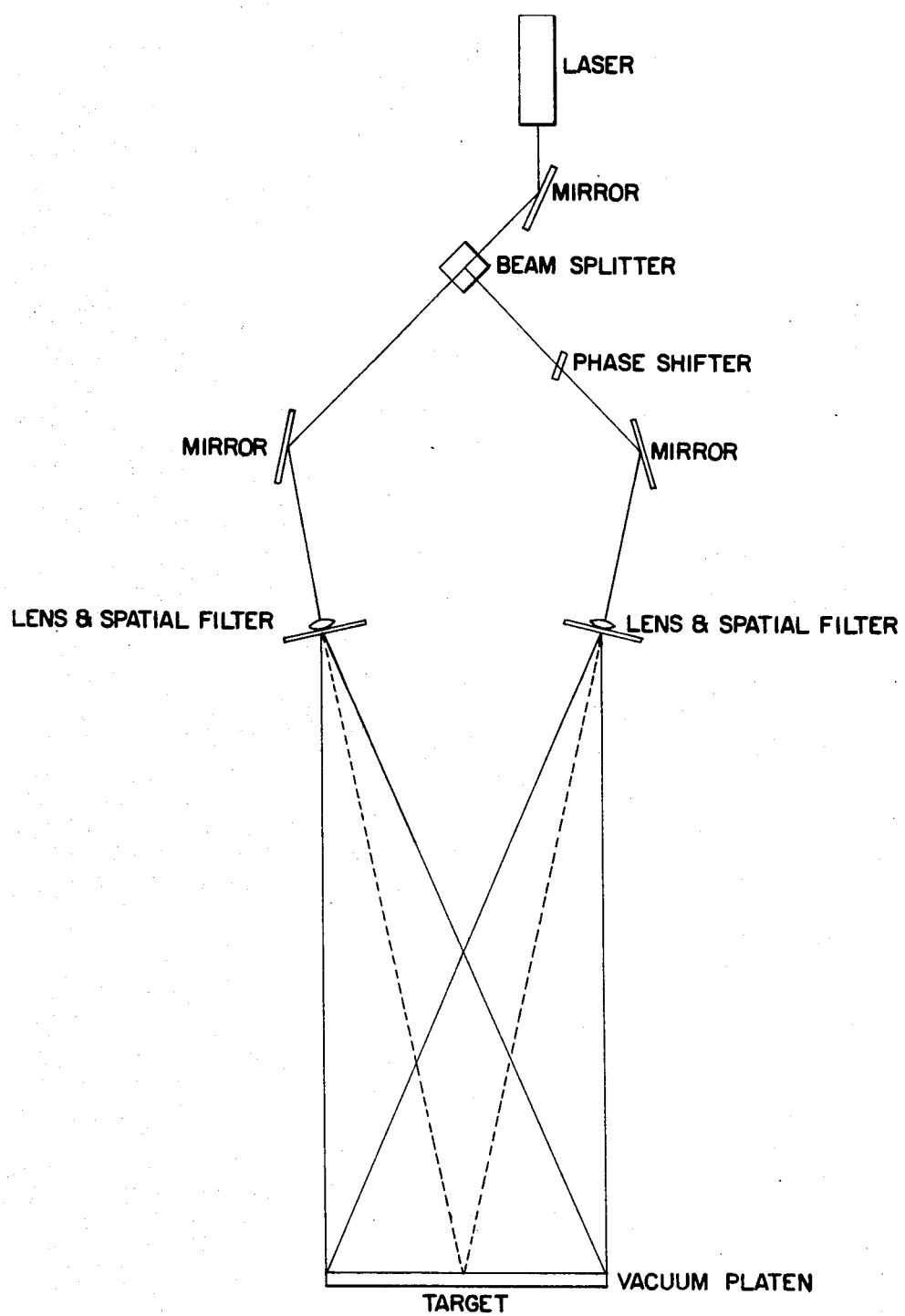
FIG. 1 is a schematic representation of a laser diffraction imaging arrangement.
Figure 2:
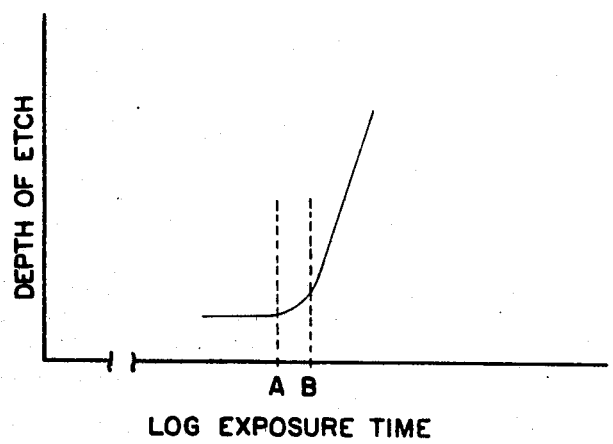
FIG. 2 is a graph of etch depth versus exposure characteristics of a positive photoresist.

A typical laser-target arrangement for exposure of a photoresist is shown in FIG. 1. The present invention takes advantage of the fact that the exposure-development characteristics of photoresists are non-linear. FIG. 2 shows this characteristic graphically. One axis of the graph shows the depth of the photoresist which can be etched away upon development as a result of the light exposure and the other axis is a log of the light exposure time. During the initial exposure or induction period, depth of the developmental etch (i.e., the amount of positive photoresist which can be removed by etching) is de minimis. After a given length of time, the exposure reaches zone A-B, known as the effective threshold for linear response, after which the development (or etch) as a function of the time of exposure is substantially linear until essentially all of the exposed photoresist is etched away by developer. The length of time required to reach the effective threshold varies depending on the particular photoresist employed.

The procedure of the present invention involves exposing the photoresist to two separate interference patterns, one with the target in a given initial orientation and the second with the target rotated at a given angle about an axis perpendicular to its surface. For a rectangular periodic array, the angle of rotation is 90°.

The double exposure procedure of the present invention results in the surface of the photoresist being exposed to two sets of maxima intensity lines. At least one and preferably each of the individual exposures are controlled such that the amount of each exposure is less than the threshold exposure A-B shown in FIG. 2. The sites where the lines of exposure intersect, however, receive an amount of exposure which is above the effective threshold for linear response. Accordingly, when the photoresist is etched by contact with a developer, the points of intersections become holes. The non-intersecting points of the two sets of maxima exposure lines may be etched to form channels as shown in FIG. 3, or may be essentially unetched as shown in FIG. 6, as a result of procedures referred to in more detail below.

In the following discussion, it will be assumed that an exposure is made to a laser beam interference pattern and then a second exposure at right angles is made, the resist layer being subjected to a stimulation of sinusoidal intensities, being maximum where the intensity maxima overlap and minimum where the intensity minima overlap. Development of such a photoresist produces a rectangular two dimensional mesh or array of holes.

In order to obtain a profile that responds linearly with respect to the incident intensity, the resist layer on the substrate is given a uniform light pre-exposure. In other words, the entire surface is uniformly exposed to incoherent light to which it is sensitive, i.e., from less than about 480 nm in the blue region to around 260 nm in the ultraviolet range. Any light source can be used and the amount of exposure is to a point which is below the threshold A-B of the photoresist, as shown on FIG. 2. A typical pre-exposure can be, for example, 15 minutes of exposure from a fluorescent lamp at a distance of one meter. Mercury and Xenon arc lamps are also suitable. The pre-exposure is sufficient such that any subseqent exposure will yield a linear etch rate response to the photoresist. This pre-exposure technique is well known in conventional photography to supply film with a quantity of energy somewhat below its threshold requirements in order that the subsequent image exposure utilizes the linear response curve of the film.

After the pre-exposure, the photoresist is exposed to the two interference fringe patterns and then developed.

Photoresists developers known to the art such as Shipley AZ-351 can be used and they are typically diluted with water. Development is terminated by immersion in water followed usually by blow drying with air or nitrogen, and/or post-baking the photoresist at up to 130° C. Different relief contours can be obtained by varying the development time. This is illustrated in FIGS. 3, 4 and 5. Initially, small holes will form in an otherwise flat area and the cross-sectional contour of each will resemble a sinusoid (FIG. 3). As development proceeds, the flat areas begin to dissolve and the holes get larger (FIG. 4). Eventually a point will be reached where the separating walls become thinner until the walls are etched away completely and the holes blend into one another leaving an array of steep spires or peaks (FIG. 5). The saddle points, i.e., the points on the exposure lines halfway between the holes, can be made to etch according to the sinusoidal exposure by minimizing the pre-baking of the photoresist when it is applied to the substrate. Alternatively, the surface of the photoresist can be slightly desensitized by subjecting the surface to a more intense heat treatment than the underlying layers so that the development rate is hindered and the saddle points will not etch as deeply as in the former case. In the latter event, the underlying layers can be made to undercut the layers above them so that a table surface is obtained or, at more intense development, lollipop shaped spaced spires (FIG. 6) are obtained.

When a nearly square wave cross-sectional profile is desired, the preexposure is reduced to a minimum or eliminated entirely. To insure that the array remains symmetrical, the first interference fringe pattern exposure is longer than the second. For example, using the 442 nm line of the He-Cd laser at 50 mw output power and a target placed at 52 inches from a 40X expansion lens, the first exposure can be 34 minutes in duration and the second exposure 31 minutes. Upon development, an array of holes again begins to form, but in cross-section each hole appears as a shallow almost square wave profile (FIG. 7). This profile is a result of the area of maximum exposure etching to a greater degree than in the sinusoidal case. As development proceeds, the walls between the holes are etched away (FIGS. 8 and 9) but instead of tall spires remaining after extended development, tall, flat topped mesa or pedestal structures are realized. A particular feature of this embodiment is that there is a point where the holes just begin to touch and the remaining areas are flat (FIG. 8). By comparison, for the sinusoidal profile, the surface at this stage does not appear to be flat but rather appears undulating (FIG. 5).

It will be appreciated that the speed of development can be controlled by time and by varying the particular developer and/or the concentration thereof.

Modification to the structures described above result when the incident beams are reflected from the substrate surface on which the photoresist is coated. The light which is reflected back through the photoresist interferes with the incident light that is moving in essentially the opposite direction whereby interference fringes are formed within the layer of photoresist. The spacing L, of these fringes is described by the equation $$L = \lambda/2n,$$

wherein $\lambda$ is the exposure wavelength and n is the index of refraction of the photoresist. For example, if the exposure wavelength is 442 $\mu$m and n is 1.64, the fringes are a distance L=134.8 $\mu$m apart. They appear as contours or steps on the hole or spire pattern, as illustrated in FIG. 10. Pronounced contours with sharply defined steps result from a relatively large amount of reflected light, whereas barely discernable contours result from relatively weak reflection. If the photoresist layer is made thick enough, e.g, in the range of about 10 $\mu$m, the reflected light will be absorbed before reaching the surface of the photoresist and the reflection contours will not be formed.

An example of contouring can be seen in FIG. 10.

The relief profiles described above can be further modified with respect to contrast, i.e., the profiles can be made deeper or shallower for given exposure and development parameters. The contrast is controlled by varying the polarization of the laser light. Preferably, polarization is perpendicular to the plane of incidence which means that, if there is no drifting of the interference pattern due to instability from vibration, heat or the like, the interference pattern contrast will be maximum for any angle of incidence. If, however, polarization of one recording beam is different from the second one, the contrast will be reduced by the cosine of the angle between the two recording beams.

While the foregoing description has been made with particular reference to a symmetrical array, it will be recognized that any general type of array can be realized by changing the angle between the beams or by changing the angle of the photosensitive material around an axis perpendicular to its surface. For example, it is possible to realize a closely spaced array of holes in one dimension by making the incidence angle $\theta$ of the recording beams large and to utilize a greater distance in the second dimension by decreasing the angle $\theta$ for the second exposure. If, on the other hand, the plate rotation angle were changed to, for example, 45°, an oblong or diamond-shaped array would be realized instead of a square or retangular array.

Cross patterns can also be obtained in accordance with the present invention by variation in the optical exposure arrangement. Thus, for example, when the laser beam is expanded by a single lens and collimated by a single large mirror, portions of the wavefront can be reflected to a target by four mirrors arranged in such a way that the cross exposures are made simultaneously instead of sequentially. In other words, the mirrors act to split the wavefront instead of the amplitude as in the cases previously described. An advantage of this method is that no allowances have to be made for unequal exposures when the preexposure sequence is omitted.

FIGS. 4d, 5c, 7c, and 8d, are scanning electron micrographs at 20,000X magnification, face on view. FIGS. 6 and 9c are scanning electron micrographs at 55,000X magnification at a 40° tilt. All of the photoresist coatings were prepared by pouring Shipley photoresist AZ-1350J onto a ten mil polyester support about 6×10 inches in area and allowing the excess to flow off the edge. The thus-coated support was then air dried and prebaked for 20 minutes at 90° C. The photoresist coating was then exposed to interfering beams of radiation from a He-Cd laser at 442 nm with an intensity at the center of the photoresist coating of 16 $\mu$watts/cm$^2$ for 34 minutes. At the end of the exposure period, the photoresist coating was rotated 90° and again exposed to the interference beams of radiation for 31 minutes. The thus-exposed photoresist coating was treated with Shipley developer AZ351 diluted 5:1 with water.

The photoresist coating of FIGS. 4d and 5c were exposed to a fluorescent lamp at a distance of one meter for 12 and 15 minutes respectively before being exposed to the interfering beams of the laser for the first time. The photoresist coating of FIG. 6 was developed for 20 seconds, those of FIGS. 4d for 20 seconds, and 7c for 10 seconds and those of FIGS. 5c and 8d for 20 seconds. The dark areas in these figures represent the portion of the photoresist etched away by the developer as a result of the photosolubilization of the photoresist by exposure to the laser. The photomicrographs show clearly the controllability of the relief pattern, the uniformity of the relief pattern and the symmetry of the holes around the two axes. The photoresist coating of FIG. 6 was exposed in the same way and under the same conditions as that of FIG. 5 except that the photoresist coating was heated in an oven for 20 min. at 90° C. before the initial exposure to the laser light. The photoresist of FIG. 10 was pre-exposed to fluorescent light at a distance of 1 meter for 30 min. and exposed through the substrate and developed for 30 seconds.

It will be appreciated that various changes and modifications can be made in the method described herein without departing from the scope of the invention. A very large number of permutations and combinations of the technique described are realizable, permitting a predetermined geometric relief configuration to be obtained. The procedures of the present invention are particularly advantageous when the width of the relief contours are in the one micron range. It will be appreciated that the various embodiments which have been described herein were merely for the purpose of illustrating the present invention but were not intended to limit it.

What is claimed is:

1. A method of producing a surface relief pattern of predetermined configuration in a photosensitive material which comprises exposing said photosensitive material at a first position to a laser interference pattern, exposing said material at a second position to a laser interference pattern, said second position being a rotation of said photosensitive material or of said laser interference pattern about an axis perpendicular to said material's surface from said first positions, wherein at least one of said exposures is below the effective threshold for linear response of said material, the points of intersection of the two patterns being exposed above said threshold as a result of the combined exposures, and developing said material.

2. The method of claim 1, wherein each of said exposures are individually below said threshold of said material.

3. The method of claim 2, wherein said material is developed by contacting said photosensitive material with an etchant and the time of contact therewith is regulated so as to achieve the desired predetermined configuration.

4. The method of claim 3 wherein said contact with etchant is effected so as to obtain small holes.

5. The method of claim 3 wherein said contact with an etchant is effected so as to obtain spires.

6. The method of claim 1, wherein said photosensitive material is rotated from said first position to said second position.

7. The method of claim 6 wherein said first and second positions are at substantially right angles to each other.

8. The method of claim 7 wherein said photosensitive material is given a substantially uniform overall exposure with light to which it is sensitive in an amount below said threshold for linear response of said material before said photosensitive material is exposed to said laser interference pattern in said first position whereby a sinusoidal relief profile is obtained after development.

9. The method of claim 7 wherein said photoresist is only exposed to said laser interference patterns whereby a substantially square wave relief profile is obtained after development.

10. The method of claim 9 wherein said exposure in said first position is longer than said exposure in said second position.

11. The method of claim 10 wherein said contact with an etchant is effected so as to obtain small holes interconnected by flat areas.

12. The method of claim 11 wherein said contact with an etchant is effected so as to obtain a relief pattern of flat topped pedestals.

13. The method of claim 7 wherein said exposures are effected so as to generate reflection waves during said exposures.

14. The method of claim 13 wherein said photosensitive material is carried on a light transmitting substrate and said exposures are made through said substrate.

15. The method of claim 1, wherein said photosensitive material is a positive photoresist.

16. The method of claim 1 wherein said photosensitive material is pre-baked prior to exposure in said first position.

17. The method of claim 1, 15, 3, 4, 11, 13 or 14, wherein each of said interference patterns has at least 1000 lines per millimeter.

* * * * *